United States Patent [19]
Walker et al.

[11] Patent Number: 5,320,487
[45] Date of Patent: Jun. 14, 1994

[54] SPRING CLIP MADE OF A DIRECTIONALLY SOLIDIFIED MATERIAL FOR USE IN A GAS TURBINE ENGINE

[75] Inventors: Roger C. Walker, Middletown; Christopher C. Glynn, Hamilton; Robert E. Allen, Cincinnati, all of Ohio

[73] Assignee: General Electric Company, Cincinnati, Ohio

[21] Appl. No.: 6,231

[22] Filed: Jan. 19, 1993

[51] Int. Cl.⁵ ............................................. F03B 11/02
[52] U.S. Cl. ............................. 415/173.3; 415/209.2; 415/190; 415/174.2
[58] Field of Search ............... 415/173.1, 173.3, 174.2, 415/189, 190, 209.2, 209.3

[56] References Cited

U.S. PATENT DOCUMENTS

| | | | |
|---|---|---|---|
| 3,104,091 | 9/1960 | Vivian | 415/190 |
| 3,387,820 | 6/1968 | Smith | 415/214.1 |
| 3,520,635 | 7/1970 | Killmann et al. | 415/173.1 |
| 4,169,726 | 10/1979 | Fairbanks | 415/173.1 |
| 4,288,259 | 9/1981 | Pearson et al. | 148/32 |
| 4,332,523 | 6/1982 | Smith | 415/173.1 |
| 4,605,452 | 8/1986 | Gemma et al. | 148/404 |
| 4,630,994 | 12/1986 | Gross | 415/190 |
| 4,632,634 | 12/1986 | Vinciguerra et al. | 415/189 |
| 4,687,413 | 8/1987 | Prario | 415/190 |
| 4,907,946 | 3/1990 | Ciokajlo et al. | 415/209.3 |
| 5,071,054 | 12/1991 | Dzugan et al. | 228/119 |
| 5,131,811 | 7/1992 | Johnson | 415/209.2 |
| 5,188,457 | 2/1993 | O'Hara | 374/104 |

OTHER PUBLICATIONS

French Patent Application having Registration No. 92 10278, filed Aug. 26, 1992 and corresponding English language translation.

*Primary Examiner*—Edward K. Look
*Assistant Examiner*—Mark Sgantzos
*Attorney, Agent, or Firm*—Jerome C. Squillaro

[57] ABSTRACT

The present invention discloses a spring clip made of a directionally solidified nickel-base superalloy for use in a high pressure compressor stator sub-assembly of a gas turbine engine. The spring clip includes a body section and a pair of arms integrally connected to opposing sides of the body section and the spring clip is used as a means for attaching circumferentially segmented flow-path liners to an annular casing. Each arm of the spring clips exerts a spring force against a flowpath liner mount lug causing the mount lug to be seated radially against an inner surface of the casing and axially against an annular seal, wherein the pair of arms of each spring clip engage mount lugs located on circumferentially adjacent ones of the flowpath liners. The spring clip material has a relatively low modulus of elasticity in a direction which is generally parallel to a longitudinal axis of the spring clip, and to the base surface of the spring clip arms, and a relatively high modulus of elasticity in a direction which is parallel to the centerlines of the holes used to fixedly connect the body sections of the spring clips to the casing. Accordingly, the spring clip of the present invention has a smaller size and reduced weight, as compared to a clip made of a conventional equiax nickel-base superalloy, with no loss in preload capability of the fasteners used to attach the body sections of the clips to the casing.

9 Claims, 5 Drawing Sheets

SPRING CLIP MADE OF A DIRECTIONALLY SOLIDIFIED MATERIAL FOR USE IN A GAS TURBINE ENGINE

FIELD OF THE INVENTION

The present invention relates to gas turbine engines, and more particularly to a spring clip made of a directionally solidified material for use in a high pressure compressor stator sub-assembly of gas turbine engines.

RELATED ART

Conventional high bypass ratio turbofan engines, which are included in the more general category of gas turbine engines and which may be used for aircraft propulsion, typically include a fan, booster, high pressure compressor, combustor, high pressure turbine and low pressure turbine in serial axial flow relationship. A portion of the air entering the engine passes through the fan, booster and high pressure compressor, being pressurized in succession by each component. The compressed air exiting the high pressure compressor, commonly referred to as the primary or core gas stream, then enters the combustor where the pressurized air is mixed with fuel and burned to provide a high energy gas stream. After exiting the combustor, the high energy gas stream then expands through the high pressure turbine where energy is extracted to operate the high pressure compressor which is fixedly connected to the high pressure turbine. The primary gas stream then enters the low pressure turbine where it is further expanded, with energy extracted to operate the fan and booster which are fixedly connected to the low pressure turbine. The remainder of the air flow which enters the engine, other than the primary gas stream continuing through the turbines and any cooling air flow, which may be diverted from the primary gas stream at various locations such as the high pressure compressor discharge for cooling high temperature components, passes through the fan and exits the engine through a system comprising annular ducts and a discharge nozzle, thereby creating a large portion of the engine thrust.

The high pressure compressor, as well as other components of the engine, typically includes a plurality of alternating axially arranged stages of stationary vanes and rotating blades which are exposed to the hot gases of the primary gas stream. The rotating blades of each stage are attached to annular disks which rotate about the longitudinal centerline of the engine. The stator vanes are typically connected to outer platforms or flowpath liners which in turn are connected to an annular casing surrounding the stages of vanes and blades. The stator assemblies of components such as the high pressure compressor also include flowpath liners or shrouds surrounding the tips of the rotating blades. As known in the art, flowpath liners which are exposed to the hot gases of the primary gas stream typically comprise a plurality of circumferentially extending segments. The circumferential segments reduce hoop stresses in the liners and also enhance control of the location of the flowpath and radial clearances between rotating blade tips and the liners which surround the blade tips.

Various means have been employed in the art for attaching circumferentially segmented stator components, such as flowpath liners, to the corresponding stator support structures. One such known means may be referred to as a tongue-and-groove concept where a C-shaped channel is typically formed in a support structure such as a casing by radially spaced apart flanges, with the channel engaging an axially extending flange formed on the circumferentially segmented component. The disadvantages with this concept are that manufacturing tolerances can create a relatively loose fit of the flange within the channel which results in a source of leakage gases and which creates poor positional control of the segmented component, which in turn can adversely affect rotor to stator operating clearances.

Another attaching means known in the art is the use of the bolted joint concept wherein a flange of the circumferentially segmented component is bolted to a mating flange of the support structure using two or more bolts. Typically one of the bolts is inserted in the mating hole with a tight fit while the remaining bolts are inserted in relatively loosely fitting holes to allow for thermal expansion of the segmented component relative to the support structure. This concept also exhibits disadvantages similar to those of the tongue-and-groove concept due to the fact that the loose-fitting bolt holes are a source of leaks and cause relatively poor positional control of the segmented component. If two tight-fitting bolts are used to resolve the positional problem, high thermal stresses can result in the segmented component which typically responds thermally faster than the corresponding support structure.

It has been found advantageous in some applications to utilize mechanical springs in order to overcome the previously discussed disadvantages of the tongue-and-groove and bolted joint designs, wherein the mechanical spring is configured to provide the required clamp load between mating parts while allowing thermal expansion of the circumferentially segmented components. One such application of a mechanical spring can be found in the high pressure turbine of the CF6-80 family of engines manufactured by the General Electric Company, the assignee of the present invention, wherein a central portion of the spring is bolted to a stationary nozzle segment and opposing end portions of the spring provide the required clamp load between circumferentially segmented interstage seals and the mating nozzle segments, while permitting thermal expansion of the interstage seal segments relative to the nozzle segments and while providing the required spatial positioning of the seal segments which are positioned radially outward of rotating seal teeth. Whereas the use of mechanical springs result in advantages over other means of attachment such as the tongue-and-groove and bolted joint designs, disadvantages associated with the use of mechanical springs remained unsolved prior to the present invention. The use of mechanical springs typically requires design compromises to achieve the required flexibility while maintaining acceptable stresses within the available space for installing the spring. For instance, tradeoffs must be made between the force exerted by the spring and the physical dimensions and corresponding weight of the spring, and in some instances the required spring force may dictate a spring size in excess of the available space, thereby prohibiting use of the spring, or may result in a spring exceeding design weight goals. Another problem can arise when the difference between the spring deflection corresponding to the maximum allowable spring stress and the spring deflection corresponding to the minimum required spring force or preload is smaller than the dimensional stack-up tolerances of the spring and the mating components. Prior to the present invention, conventional mechanical springs, such as the aforementioned spring used for attaching high pressure turbine interstage seals, have been made of equiax materials which exhibit isotropic mechanical properties such as Young's modulus of elasticity.

Directionally solidified nickel-base superalloys have been used in the art previously as an alternate material, in place of equiax nickel-base superalloys commonly used in gas turbine engines, for various high temperature components such as the high pressure turbine blades of gas turbine engines for reasons which may be more fully appreciated in light of the following characteristics of these materials. Directionally solidified materials, including directionally solidified nickel-base superalloys, are manufactured using a specially-controlled casting process, known in the art, and may comprise a polycrystalline structure wherein grain boundaries are eliminated in one direction or a single crystalline structure wherein grain boundaries are eliminated in three mutually perpendicular directions. Directionally solidified nickel-base superalloys exhibit anisotropic mechanical properties, including Young's modulus of elasticity, wherein a relatively low modulus of elasticity, as compared to the modulus of elasticity for conventional equiax nickel-base superalloys, is produced in the <001> growth direction, or grain growth direction, of the directionally solidified nickel-base superalloys. For polycrystalline directionally solidified nickel-base superalloys the modulus of elasticity in the plane which is transverse to the growth direction, is approximately the same as that for conventional equiax nickel-base superalloys and is relatively high as compared to the aforementioned modulus of elasticity in the <001> direction. For single crystalline directionally solidified nickel-base superalloys the modulus of elasticity in the [001] direction is approximately the same as that existing in the [100] and [010] directions, wherein the modulus of elasticity in all three mutually perpendicular directions is low. All other orientations are higher, some even higher than the modulus of elasticity of conventional equiax nickel-base superalloys. With respect to low cycle fatigue, high cycle fatigue and tensile yield strength properties, directionally solidified nickel-base superalloys exhibit higher properties in the high temperature zone of the material, approximately the same properties in the transition temperature zone, and lower properties in the low temperature zone, than the corresponding properties of conventional equiax nickel-base superalloys. As known in the art, high pressure turbine blades are exposed to very hot flowpath gases, with temperatures in excess of 2000° F. not uncommon, flowing over the exterior of the blades which requires the interior of the blades to be cooled. Consequently, thermal fatigue is an important design consideration for high pressure turbine blades. Also, as known in the art, in the high temperature zone stress fractures typically occur along grain boundaries of the material. Based on the foregoing it can be seen that directionally solidified nickel-base superalloys have been advantageously used for high temperature components such as high pressure turbine blades for the following reasons: higher mechanical properties than conventional equiax nickel-base superalloys in the high temperature zone; alignment of the [001] direction of the material with the radial direction of the blade eliminates grain boundaries in the direction of principal stress caused by the centrifugal force exerted on the blades; the relatively low modulus of elasticity along the [001] direction enhances thermal fatigue capability since for a given strain, lower stresses are produced as compared to conventional equiax nickel-base superalloys.

In contrast to high temperature components such as high pressure turbine blades, directionally solidified nickel-base superalloys have not previously been used in relatively lower temperature components such as those found in the high pressure compressor for the following reasons. Although thermal fatigue must be addressed, it is not a major design consideration due to the exposure of compressor rotor and stator components to considerably lower temperatures, which, for instance, typically results in compressor blades not being cooled internally, in contrast to high pressure turbine blades. Also, for parts which operate in the low temperature zone, directionally solidified nickel-base superalloys have not been an attractive option due to lower mechanical properties than an equiax counterpart. For parts which operate in the transition temperature zone there has not previously been an economic incentive to utilize directionally solidified materials even though the mechanical strength properties are approximately the same as those of a conventional equiax material since the directionally solidified material is significantly more expensive. For instance, if the cost of a cast equiax nickel-base superalloy is taken as a baseline, the cost of the corresponding polycrystalline directionally solidified material may be roughly twice as expensive and the cost of the corresponding single crystalline directionally solidified material may be roughly three times as expensive.

The present invention utilizes directionally solidified materials in a unique manner to resolve the problems associated with prior mechanical springs made of an equiax material.

SUMMARY OF THE INVENTION

Accordingly, the present invention is directed to a spring clip for use in a high pressure compressor stator sub-assembly of a gas turbine engine which is responsive to the aforementioned needs and which therefore includes the following objects:

To provide an improved mechanical spring;

To provide a spring clip made of a directionally solidified material having a relatively low modulus of elasticity in a first direction which is generally parallel to a longitudinal axis of the spring clip and a relatively high modulus of elasticity in a second direction which is generally perpendicular to the longitudinal axis;

To provide a spring clip made of a directionally solidified material for use in a high pressure compressor stator sub-assembly of a gas turbine engine which has smaller physical dimensions, and therefore which may be installed in a smaller space and weighs less, than a clip made of a conventional equiax material having acceptable mechanical strength properties;

To provide a spring clip made of a directionally solidified material for use in attaching circumferentially segmented flowpath liners to an annular casing in a high pressure compressor stator sub-assembly of a gas turbine engine, wherein the directionally solidified spring clip can accommodate a wider range of installation stack-up tolerances, while exerting the required force against the segmented liners, than a clip made of a conventional equiax material having acceptable mechanical strength properties..

According to a preferred embodiment of the present invention, the spring clip comprises a body section and a pair of arms integrally connected to opposing sides of the body section, wherein the spring clip is made of a directionally solidified material having a relatively low modulus of elasticity in a first direction parallel to a longitudinal axis of the spring clip and a relatively high modulus of elasticity in a second direction which is perpendicular to the longitudinal axis.

Another preferred embodiment according to the present invention is directed to a stator sub-assembly for a gas turbine engine, with the stator sub-assembly comprising: a high pressure compressor inner annular casing; an annular T-shaped seal having a radially outer end positioned in a stepped land formed in a radially inner surface of the compressor casing; a plurality of circumferentially segmented flowpath liners positioned radially inward of the casing, wherein each of the flowpath liners includes a radially extending mount lug located at each of circumferentially opposite ends of the liner and wherein each liner supports a plurality of stationary vanes; means for attaching the flowpath liners to the compressor casing and for positioning the liners in an axially abutting relationship with the annular T-shaped seal; wherein the means for attaching and positioning comprises a plurality of spring clips, each of the spring clips made of a directionally solidified material having a relatively low modulus of elasticity in a first direction parallel to a longitudinal axis of the spring clip and a relatively high modulus of elasticity in a second direction which is perpendicular to the longitudinal axis; wherein the directionally solidified material is a nickel-base superalloy. Each of the spring clips includes a body section, having a pair of holes therethrough, and a pair of arms integrally connected to opposing sides of the body section, wherein the pair of arms resiliently engages a pair of the flowpath liner mount lugs, with a first one of the pair of lugs being integral with one of the liners and the second one of the pair of lugs being integral with a circumferentially adjacent one of the liners. The means for attaching and positioning further comprises a plurality of fasteners for fixedly attaching each of the spring clip body sections to the compressor casing using the pair of holes in each body section. The material is oriented such that the relatively low modulus of elasticity exists in a direction which is parallel to a base surface of the spring clip arms while the relatively high modulus of elasticity extends in a direction which is parallel to a centerline of each of the spring clip body section holes. Torquing of the fasteners forces a radially outer and axially aft facing surface of each of the body sections of the spring clips to contact a radially outer and axially forward facing surface of the annular T-shaped seal. The arms of the spring clips force respective ones of the mount lugs radially outward and axially aft, wherein a radially outer surface of each of the mount lugs is forced against a radially inner surface of the casing and wherein an axially aft and radially inner surface of each of the mount lugs is forced against a radially inner leg of the annular T-shaped seal. Utilization of the directionally solidified nickel-base superalloy permits a minimization of a size and a weight of the spring clips which allows the spring clips to be installed in a smaller space, and also permits an accommodation of a greater range of stack-up tolerances associated with the spring clips and the mount lugs of the flowpath liners, as compared to the use of clips made of an equiax nickel-base superalloy.

BRIEF DESCRIPTION OF THE DRAWINGS

The foregoing and other objects, features and advantages of the present invention will become more apparent from the following detailed description of the preferred embodiments when taken in conjunction with the accompanying drawings in which.

DETAILED DESCRIPTION

Figure 1:
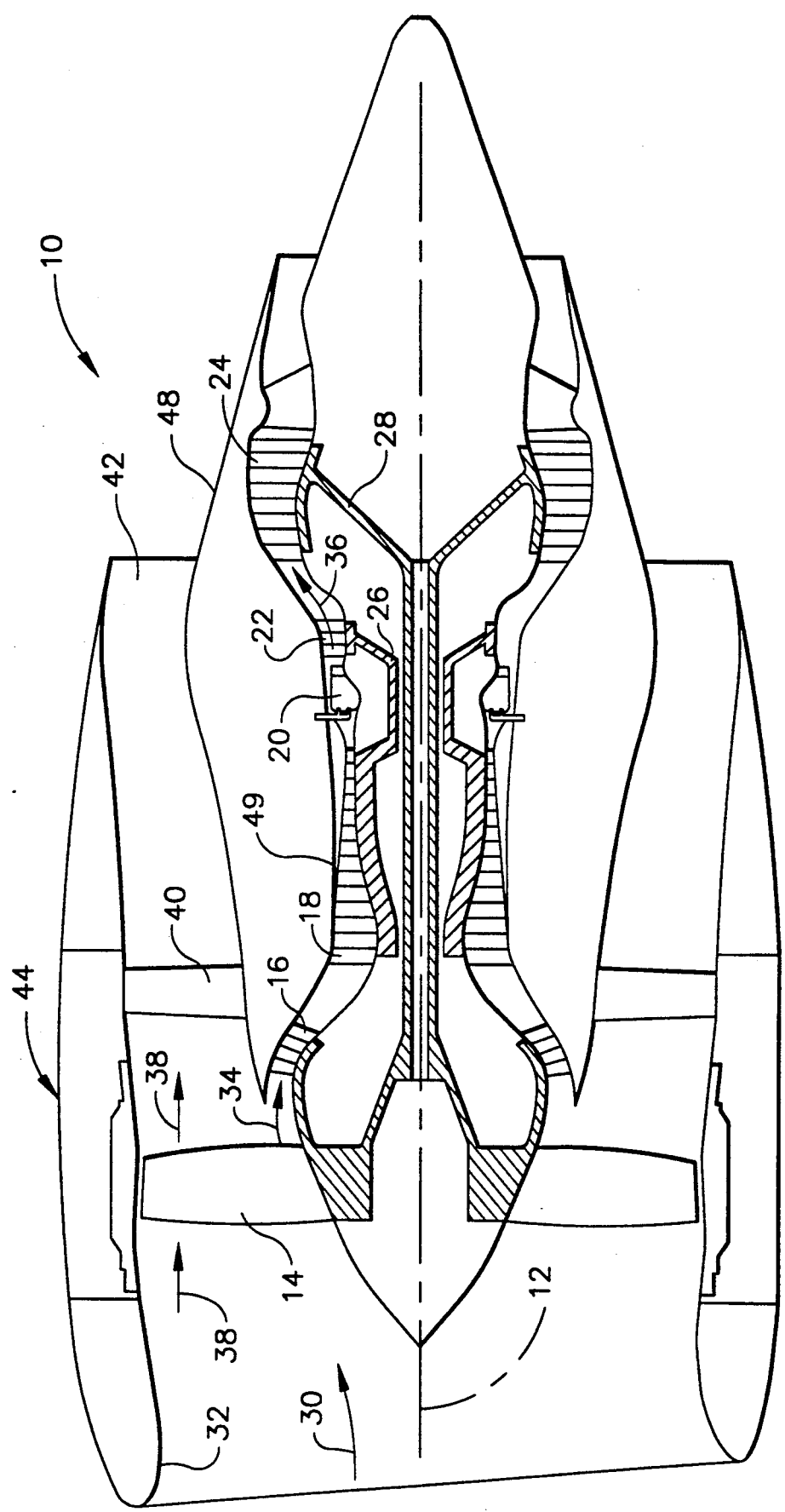
FIG. 1 is a longitudinal cross section of an exemplary high bypass ratio turbofan engine which can incorporate the spring clip of the present invention.

Referring now to the drawings, wherein like reference numerals have been used for similar elements throughout, FIG. 1 illustrates a longitudinal cross section of an exemplary high bypass ratio turbofan engine 10. The engine 10 includes, in serial axial flow communication about a longitudinal centerline axis 12, conventional structures including a fan 14, booster 16, high pressure compressor 18, combustor 20, high pressure turbine 22 and low pressure turbine 24. High pressure turbine 22 is drivingly connected to high pressure compressor 18 with a first rotor shaft 26 and low pressure turbine 24 is drivingly connected to both the booster 16 and fan 14 with a second rotor shaft 28.

During operation of engine 10 ambient air 30 enters engine inlet 32 and a first portion, denoted the primary or core gas stream 34, passes through fan 14, booster 16 and high pressure compressor 18, being pressurized by each component in succession. Primary gas stream 34 then enters combustor 20 where the pressurized air is mixed with fuel to provide a high energy gas stream 36. The high energy gas stream 36 then enters in succession high pressure turbine 22 where it is expanded, with energy extracted to drive high pressure compressor 18, and low pressure turbine 24 where it is further expanded, with energy being extracted to drive fan 14 and booster 16. A second portion of ambient air 30, denoted the secondary or bypass airflow 38, passes through fan 14 and fan outlet guide vanes 40 before exiting the engine through annular duct 42, which is formed by components of nacelle assembly 44, and core cowl 48, wherein secondary flow 38 provides a significant portion of the engine thrust.

Figure 2:
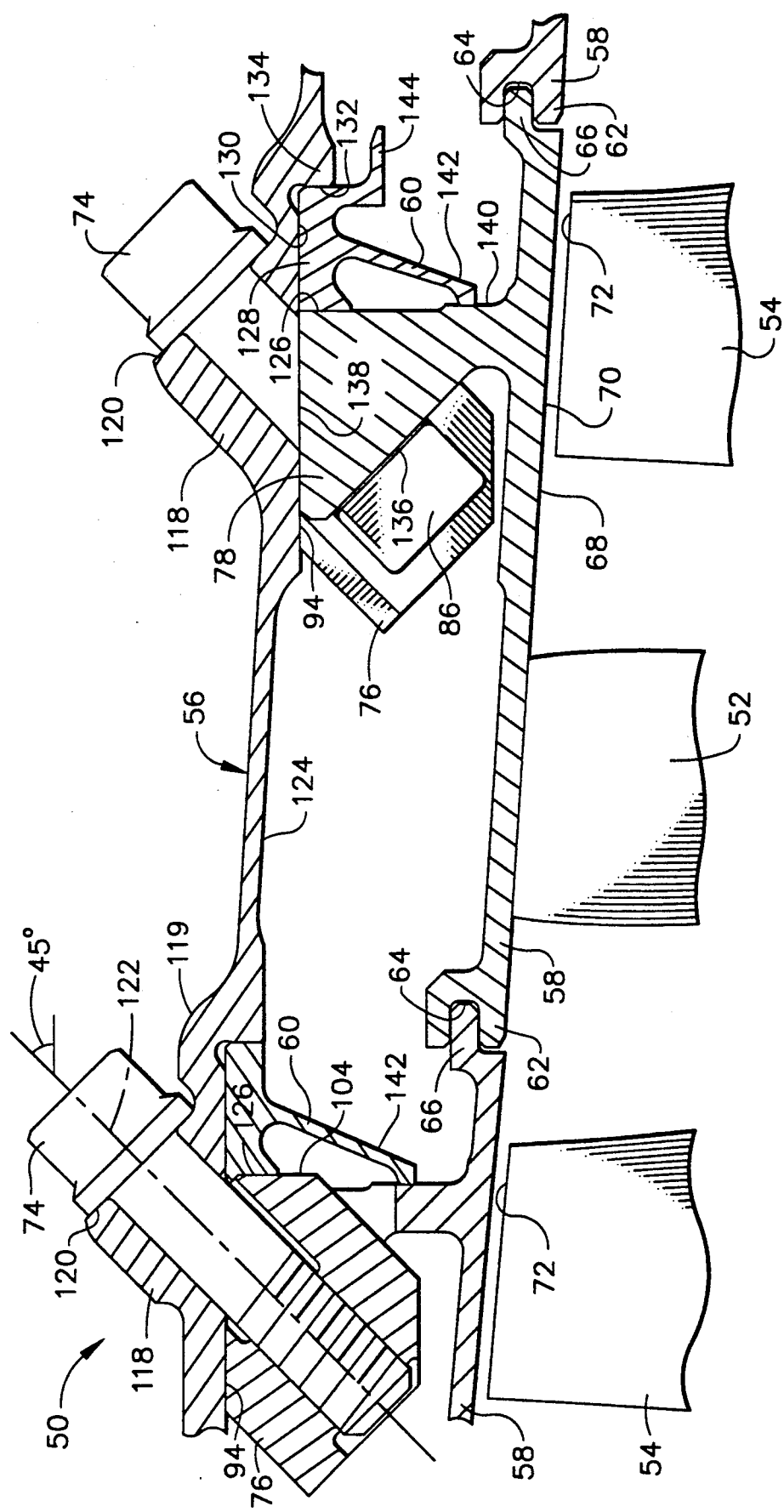
FIG. 2 is an enlarged fragmentary longitudinal cross-section of the high pressure compressor stator sub-assembly of the engine of FIG. 1.

FIG. 2 is an enlarged fragmentary cross-section of a high pressure compressor stator sub-assembly 50 of the high pressure compressor 18 of FIG. 1. Compressor 18 comprises a plurality of axially alternating stages of stationary vanes 52 and rotating blades 54 wherein each stage of rotating blades 54 are supported by annular disks (illustrated schematically in FIG. 1 and not shown in FIG. 2) of a high pressure compressor rotor (illustrated schematically in FIG. 1 and not shown in FIG. 2). Each stage of stationary vanes is supported by stator structure which includes outer annular compressor casing 49 (illustrated schematically in FIG. 1 and not shown in FIG. 2). In the preferred embodiment outer casing 49 comprises first and second axially extending portions (not shown) with the second, or aft, portion supporting high pressure compressor inner annular casing 56, of stator sub-assembly 50, which is made of a one-piece 360°, or full round, construction. Stator sub-assembly 50 includes a plurality of stages of circumferentially segmented flowpath liners 58, which are positioned radially inward of inner casing 56, and a plurality of annular T-shaped seals 60, wherein respective ones of the seals 60 engage the flowpath liners 58 of each stage in a manner to be discussed in greater detail subsequently. In the preferred embodiment the plurality of flowpath liners 58 support the stationary vanes 52 for stages 6–10 of compressor 18. Each of the segmented flowpath liners 58 of each stage supports a plurality of vanes 52, wherein each of the vanes 52 is integrally attached to corresponding ones of liners 58. Each liner includes an axially forward hook 62 with an axially forward facing C-shaped channel 64 formed therein, and an axially extending aft flange 66. The flowpath liners 58 of axially adjacent stages are interlocked together by inserting aft flanges 66 of a forward stage of liners 58 into the axially forward facing C-shaped channels of the liners 58 of an axially adjacent and aft stage of liners 58. A radially inner surface 68 of the plurality of flowpath liners 58 forms an outer boundary of an annular flowpath for primary gas stream 34 for the corresponding stages of compressor 18. An axially aft portion 70 of inner surface 68 of liners 58 forms a radially extending annular clearance with tips 72 of blades 54.

Figure 3:
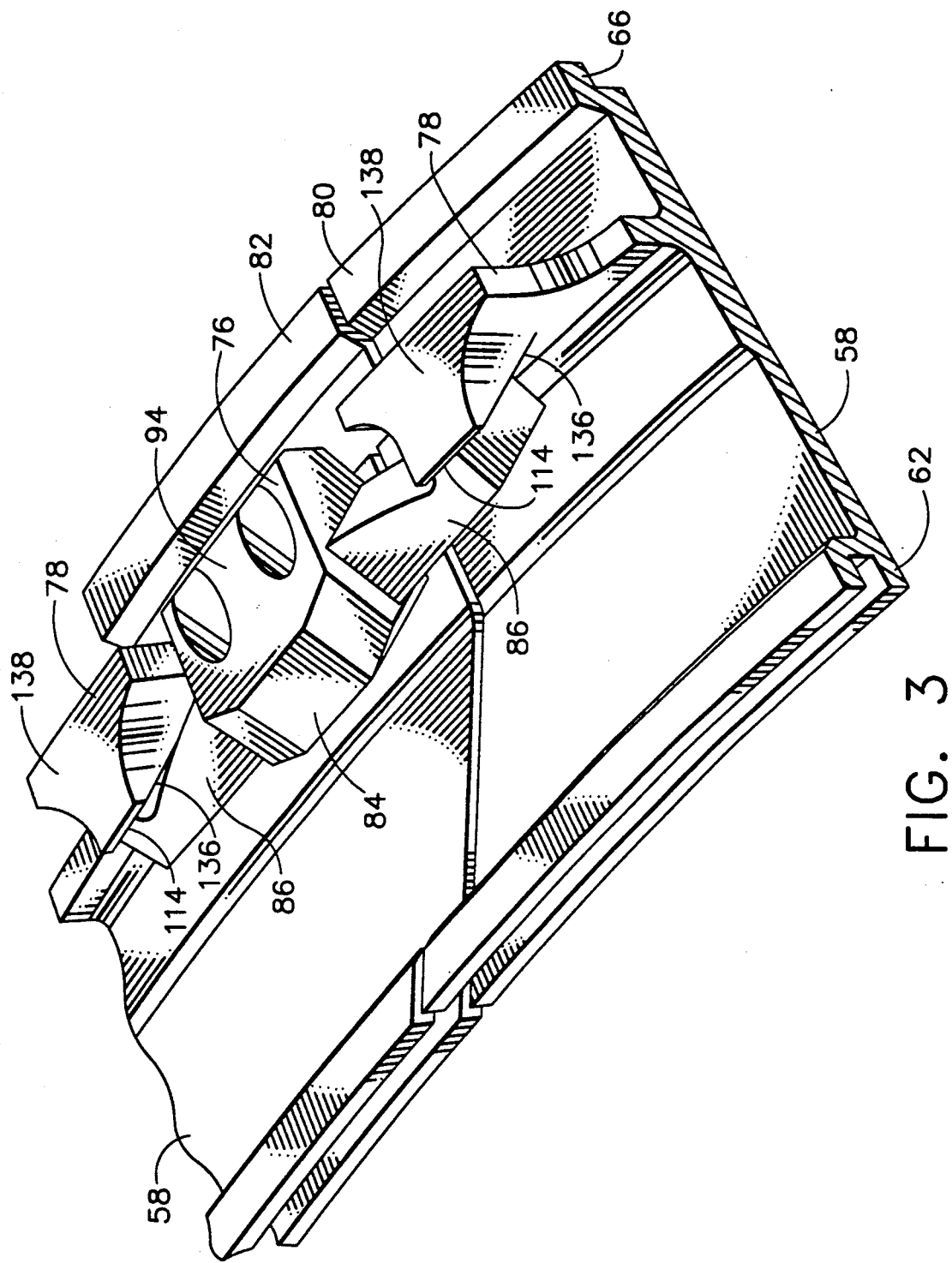
FIG. 3 is a perspective view of the spring clip of the present invention engaging circumferentially adjacent ones of the flowpath liners depicted in FIG. 2.
Figure 4:
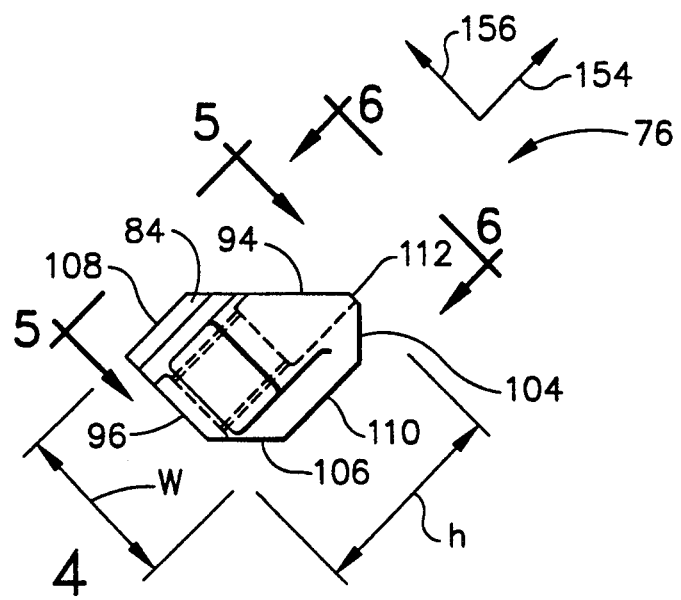
FIG. 4 is an end view of the spring clip of the present invention.
Figure 5:
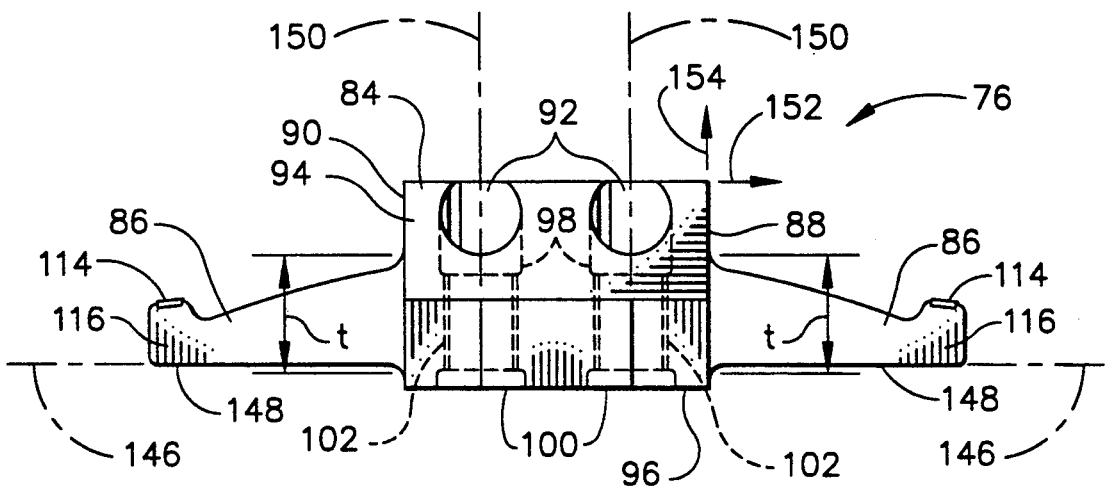
FIG. 5 is a longitudinal view of the spring clip of the present invention taken along line 5—5 in FIG. 4.
Figure 6:
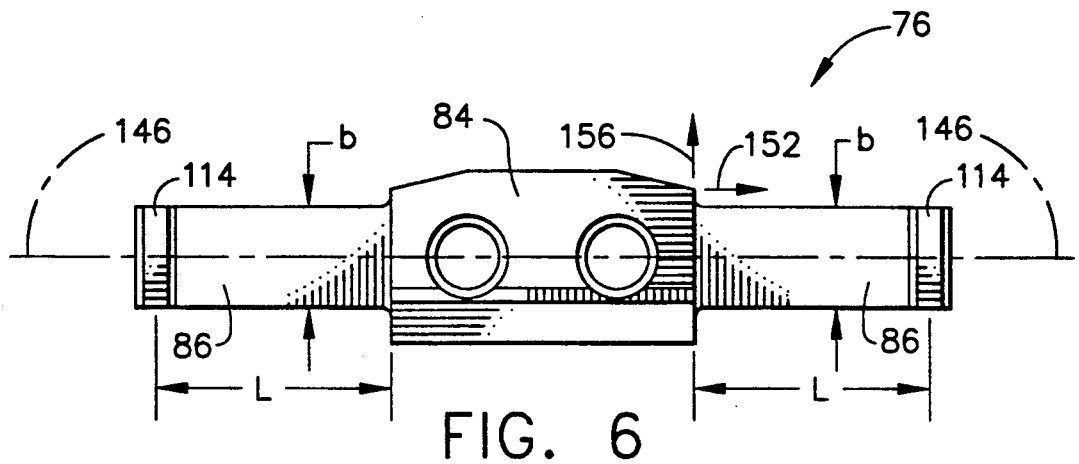
FIG. 6 is a plan view of the spring clip of the present invention taken along line 6—6 in FIG. 4.

The flowpath liners 58 are attached to inner casing 56 by a plurality of fasteners 74, which may be conventional bolts, and a plurality of spring clips 76, which are illustrated in greater detail in FIGS. 3–6. As best seen in FIG. 3, each flowpath liner 58 includes a radially extending mount lug 78 which is located at each of circumferentially opposite ends 80, 82 of liner 58, wherein each lug 78 is integral with a corresponding liner 58 and wherein a lug 78 located at end 80 of one of the circumferentially segmented liners 58 is circumferentially adjacent to a lug 78 located at end 82 of a circumferentially adjacent liner 58. Each spring clip includes a body section 84 and a pair of arms 86 which are integrally connected to opposing sides 88, 90 of body section 84. As illustrated in FIG. 3, the pair of arms 86 of spring clip 76 resiliently engages a pair of mount lugs 78, wherein a first one of the pair of mount lugs 78 is integral with one of the flowpath liners 58 and a second one of the pair of mount lugs 78 is integral with a circumferentially adjacent one of the flowpath liners 58. As best seen in FIG. 5, each body section 84 includes a pair of holes 92 which extend through body section 84 from a first inclined surface 94 through an inner surface 96. Each hole includes outer and inner counterbores 98 and 100 respectively, with threads 102 extending therebetween. Counterbores 98 and 100 prevent threads 102 from existing on first inclined surface 94, which is stressed compressively during assembly, and inner surface 96. As best seen in FIG. 4, a cross-section of body section 84 exhibits an irregular polygonal shape comprising first, second and third inclined surfaces 94, 104, and 106, respectively, inner surface 96, opposite and parallel surfaces 108 and 110, and an outer break-edge surface 112 which extends between first inclined surface 94 and second inclined surface 104. When spring clip 76 is installed in stator assembly 50, as shown in FIGS. 2 and 3, first inclined surface 94 comprises a radially outer and radially facing surface of body section 84 and second inclined surface 104 comprises a radially outer and axially aft facing surface of body section 84. As best seen in FIGS. 5 and 6, each arm 86 of spring clip includes a contact surface 114 located on a free end 116 of arm 86 which is opposite the end of arm 86 which is integrally connected to body section 84. Casing 56 includes a plurality of mount bosses 118 formed on an exterior surface 119 of casing 56, wherein bosses 118 include a plurality of through holes which are aligned with holes 92 of body section 84. Bosses 118 also include an inclined surface 120 which mates with a bearing surface of fasteners 74. Fasteners 74 are inserted through the holes in bosses 118 and threaded into corresponding ones of aligned holes 92 in body section 84, thereby fixedly attaching body sections 84 of spring clips 76 to casing 56. Due to the orientation of inclined surface 120, an installed centerline 122 of fasteners 74 is inclined at an angle, which is preferably 45°, relative to the longitudinal centerline axis 12, of engine 10.

Torquing of fasteners 74 forces first inclined surface 94 of body section 84, wherein surface 94 comprises a radially outer and radially facing surface as installed, against a radially inner surface 124 of casing 56 and also forces second inclined surface 104 of body section 84, wherein surface 104 comprises a radially outer and axially aft facing surface as installed, to contact a radially outer and axially forward facing surface 126 of annular T-shaped seal 60, which has radially outer end 128 positioned in a stepped land 130 formed in the radially inner surface 124 of casing 56. Contact between surface 104 of body section 84 and surface 126 of T-shaped seal 60 causes a radially outer and axially aft facing surface 132 of seal 60 to abut a shoulder 134 of stepped land 130. As best seen in FIGS. 2 and 3, contact surface 114 of arm 86 resiliently engages inclined surface 136 of a corresponding one of mount lugs 78 of flowpath liner 58. Consequently, torquing of fasteners 74 further causes arms 86 to force respective ones of mount lugs 78 radially outward and axially aft, wherein a radially outer and radially facing surface 138 of each mount lug 78 is forced against radially inner surface 124 of casing 56, wherein a radially inner portion of an axially aft surface 140 of each of the mount lugs 78 is forced against an inner leg 142 of annular T-shaped seal 60, and wherein a radially outer portion of the axially aft surface 140 of each of the mount lugs 78 is forced against surface 126 of annular T-shaped seal 60, thereby positioning each of the mount lugs 78 of liners 58 in an axially abutting and sealing relationship with annular T-shaped seal 60. Spring clips 76 and mount lugs 78 are sized, with respect to the relationship between first inclined surface 94 of body section 84 and contact surfaces 114 of arms 86 and with respect to the relationship between inclined surface 136 and radially outer surface 138 of mount lug 78, respectively, such that each arm 86 is deflected when spring clip 76 is in the installed position and fasteners 74 have been torqued. Therefore, arms 86 exert a spring force against lugs 78, which acts in a direction parallel to the centerline of fasteners 74 and which retains lugs 78 in position against casing 56 and seal 60, as described previously, throughout the normal operating range of engine 10. Lugs 78 may be allowed to unseat slightly during potential singular events such as a compressor stall.

In the preferred embodiment, high pressure compressor stator sub-assembly 50 also includes a plurality of annular thermal barriers (not shown) for stages 6, 7, 9, and 10 of compressor 18. Each of the thermal barriers are positioned radially inward of casing 56 and radially outward of flowpath liners 58 to provide additional thermal protection for casing 56. Each thermal barrier is supported on a forward end by aft lip 144 of a first one of the T-shaped seals 60, which is located in an axially forward stage, and extends axially aft where it is supported by a second one of the T-shaped seals 60 which is located in the same stage as the thermal barrier, wherein each thermal barrier includes cutouts to avoid contact with spring clips 76 of each of the affected stages. The thermal barriers have no effect on the function of the spring clips 76 of the present invention. FIG. 2 corresponds to stage 8 of compressor 18 which does not utilize a thermal shield in a preferred embodiment, for reasons which are not relevant to the present invention.

The previously discussed components of stator sub-assembly 50 are assembled as follows. After the complete rotor and first five stages of the stator of compressor 18 have been assembled, the first stage of flowpath liners 58 and vanes 52 of stator sub-assembly 50, which comprises stage 6 of compressor 18, is positioned between adjacent stages of the rotor. One of the thermal barriers is then positioned over flowpath liners 58, followed by one of the T-shaped seals 60 and spring clips 76. This process is repeated five times with the exception that the thermal barrier is omitted from stage 8. The flowpath liners 58, T-shaped seals 60 and spring clips 76 of stages 6-10, and the thermal barriers of stages 6, 7, 9, and 10, of compressor 18 are appropriately fixtured until casing 56 is installed. Fasteners 74 are inserted through holes in mount bosses 118 of each stage and are threaded into the body sections 84 of spring clips 76, and torqued, after proper alignment of holes 92 in body sections 84. The aft portion of outer casing 49 is then installed over stator sub-assembly 50, wherein the aft portion of outer casing 49 is fixedly connected to the forward portion of outer casing 49 and wherein a radially inwardly extending leg of the aft portion of outer casing 49 is fixedly connected to an aft end of inner casing 56.

The spring clip 76 of the present invention is made of a directionally solidified nickel-base superalloy, and in a preferred embodiment is made of a polycrystalline directionally solidified nickel-base superalloy which is manufactured by a casting process known in the art. In the preferred embodiment spring clip 76 comprises a one-piece casting. Two polycrystalline directionally solidified nickel-base superalloys which have been determined by the inventors to be effective are Rene-108 and MAR-M-200 which comprise the respective chemical constituents shown in Table 1. As an alternative material, the single crystalline directionally solidified nickel-base superalloy Rene-N4 has also been determined by the inventors to be acceptable. The chemical composition of Rene-N4 is also presented in Table 1. In general, spring clip 76 may be made of any directionally solidified nickel-base superalloy which has a Young's modulus of elasticity of less than $20 \times 10^6$ psi in the $<001>$, or grain growth, direction, at room temperature.

Both Rene-108 and MAR-M-200 exhibit a Young's modulus of elasticity which is less than $20 \times 10^6$ psi in the $<001>$ growth direction at room temperature which is relatively low compared to the modulus of elasticity of approximately $30 \times 10^6$ psi which exists in directions perpendicular to the growth direction. The modulus of elasticity in the $<001>$ growth direction of Rene-108 and MAR-M-200 is also relatively low when compared to the modulus of elasticity of conventional equiax nickel-base superalloys such as Inconel 718, whereas the modulus of elasticity perpendicular to the $<001>$ growth direction is comparable to that of conventional equiax nickel-base superalloys. The casting process producing spring clip 76 is controlled such that the $<001>$ growth direction is generally parallel with a longitudinal axis 146 of spring clip 76, wherein axis 146 is generally parallel to a base surface 148 of each arm 86 of spring clip 76. The casting process producing spring clip 76 is further controlled such that in the directions perpendicular to the $<001>$ growth direction the modulus of elasticity of both Rene-108 and MAR-M-200 is always high. Therefore, the modulus of elasticity in a direction which is generally parallel to a centerline 150 of each of the generally parallel holes 92 in body section 84, is relatively high. Consequently, spring clip 76 is made of a directionally solidified material having a relatively low modulus of elasticity in a first direction 152 which is generally parallel to

TABLE 1

CHEMICAL COMPOSITION OF ILLUSTRATIVE DIRECTIONALLY SOLIDIFIED MATERIALS

| Element Name | Symbol | Polycrystalline | | Single Crystalline |
|---|---|---|---|---|
| | | Rene-108 | Mar-M-200 | Rene N4 |
| Cobalt | Co | 9.5 | 10.0 | 7.5 |
| Aluminum | Al | 5.5 | 5.0 | 4.2 |
| Chromium | Cr | 8.35 | 9.0 | 9.75 |
| Titanium | Ti | 0.75 | 2.0 | 3.5 |
| Tantalum | Ta | 3.0 | 1.5 | 4.8 |
| Tungsten | W | 9.5 | 12.5 | 6.0 |
| Molybdenum | Mo | 0.5 | — | 1.5 |
| Hafnium | Hf | 1.5 | — | 0.15 |
| Carbon | C | 0.085 | 0.15 | 0.06 |
| Boron | B | 0.015 | 0.015 | 0.004 |
| Zirconium | Z | 0.01 | 0.05 | — |
| Columbium | Cb | — | 1.8 | 0.5 |
| Nickel | Ni | Balance | Balance | Balance |

Note:
Compositions tabulated are in percent by weight.

longitudinal axis 146 and base surface 148 and having a relatively high modulus of elasticity in a second direction 154 which is generally perpendicular to axis 146 and base surface 148 and which is generally parallel to hole centerlines 150. Additionally, the directionally solidified material of spring clip 76 exhibits a relatively high modulus of elasticity in a third direction 156 which is perpendicular to directions 152 and 154. It is important to note that the temperature of spring clip 76 is in the low temperature zone of the directionally solidified material, which corresponds to 800°-1200° F., during the most frequently encountered, on a time-weighted basis, operating conditions of engine 10. The modulus of elasticity in direction 152 remains relatively low in this temperature range, with a value of approximately $15-17 \times 10^6$ psi, while the modulus of elasticity in directions 154 and 156 remains relatively high, with a value of approximately 26–28 × 10⁶ psi in each direction. The fact that spring clip 76 operates in the low temperature zone would normally preclude the use of a directionally solidified nickel-base superalloy due to the somewhat lower low and high cycle fatigue and tensile yield strength properties as compared to the corresponding properties of conventional equiax nickel-base superalloys. However, in the preferred embodiment of the present invention, the fatigue and yield strength properties of the directionally solidified nickel-base superalloy are within an acceptable range and the utilization of the relatively low modulus of elasticity in direction 152, as described previously, provides overriding advantages.

If an alternative single crystalline directionally solidified nickel-base superalloy such as Rene-N4 is utilized, the [001] direction of the material is aligned with longitudinal axis 146, and direction 152, as with the polycrystalline directionally solidified materials. With the use of a single crystalline material the secondary crystallographic orientation must be controlled to align the <110> crystallographic directions with directions 154 and 156 of spring clip 76 to provide a relatively high modulus of elasticity in these directions.

The fact that the directionally solidified nickel-base superalloy of the present invention exhibits a relatively high modulus of elasticity in direction 154, as compared to the relatively low modulus of elasticity in direction 152, wherein the modulus of elasticity in direction 154 is comparable to that of conventional equiax nickel-base superalloys, is important because this avoids any loss in ability to properly preload fasteners 74 as compared to the preload capability using conventional equiax nickel-base superalloys.

Figure 7:
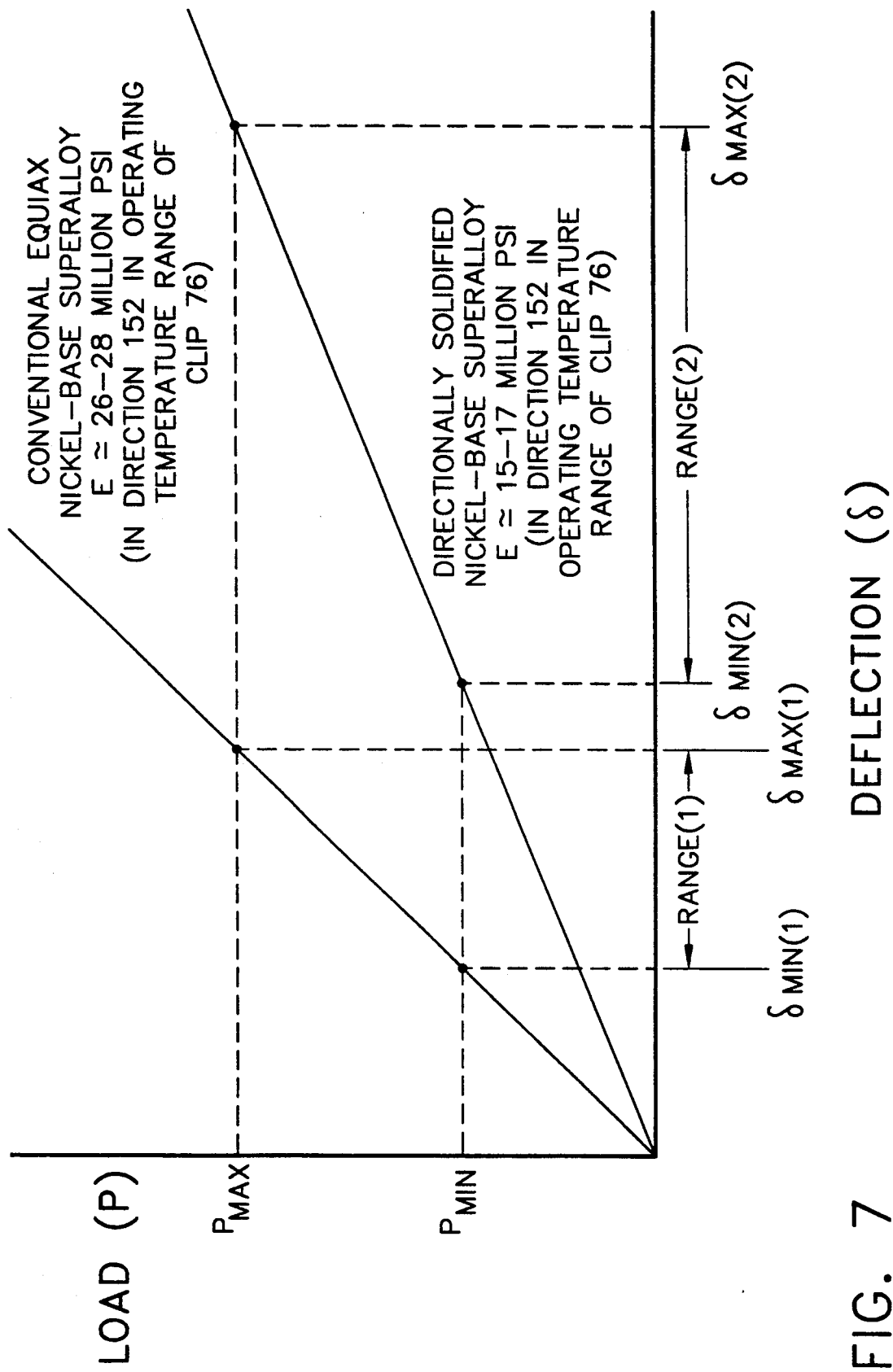
FIG. 7 depicts load versus deflection curves for the directionally solidified nickel-base superalloy of the present invention and for a conventional equiax nickel-base superalloy.

The advantages realized in aligning the <001> growth direction of the directionally solidified nickel-base superalloy with longitudinal axis 146 of spring clip 76, such that a relatively low modulus of elasticity exists in direction 152, can be illustrated by examining FIG. 7, and the spring force and beam bending stress equations which are known in the art. FIG. 7 depicts load versus deflection curves for the directionally solidified nickel-base superalloy of the present invention and for a conventional equiax nickel-base superalloy, at the operating temperature of spring clip 76, corresponding to the deflection of free end 116 of one of the arms 86 of spring clip 76. Accordingly, the curve for the directionally solidified material is based on the relatively low modulus of elasticity, of approximately 15–17 × 10⁶ psi which exists in direction 152 parallel to base surface 148 of arm 86, in contrast to the relatively high modulus of elasticity of approximately 26–28 × 10⁶ psi of the equiax material. $P_{MIN}$ is the required spring force which each arm 86 of spring clip 76 must exert against a corresponding one of mount lugs 78 of flowpath liners 58 to counteract maximum aerodynamic loads exerted on stationary vanes 52, and transmitted to flowpath liners 58, during normal operating conditions of engine 10, in order to keep lugs 78 seated against casing 56 and T-shaped seal 60 during normal operating conditions of engine 10. It can be seen that the required $P_{MIN}$ results in a deflection $\delta_{MIN(1)}$ when using a conventional equiax nickel-base superalloy and a deflection $\delta_{MIN(2)}$ when using the directionally solidified nickel-base superalloy of the present invention, wherein $\delta_{MIN(2)}$ is significantly greater than $\delta_{MIN(1)}$. The significance of this difference is illustrated by the following spring force equation for a beam corresponding to arm 86:

$$P_{MIN} = C \frac{EI}{L^3} \delta_{MIN}$$

wherein:
C = beam constant for arm 86;
E = Young's modulus of elasticity in direction 152;
I = bending moment of inertia;
L = length of arm 86 to center of contact surface 114 (FIG. 6);
$\delta_{MIN}$ = deflection of free end 116 of arm 86;

$$I = \frac{bt^3}{12};$$

b = width of arm 86 (FIG. 6);
t = thickness of arm 86 at interface with either one of opposing sides 88, 90 of body section 84 (FIG. 5).

Based on the foregoing, it can be seen that the same $P_{MIN}$ can be accomplished with smaller physical dimensions of arm 86 using the directionally solidified nickel-base superalloy of the present invention, as compared to the use of a conventional equiax nickel-base superalloy, which also results in a reduced weight of arm 86. It should be noted that some equiax materials, such as aluminum and titanium alloys, exhibit a relatively low modulus of elasticity in three mutually perpendicular directions. However, these alloys have reduced mechanical strengths, as compared to the directionally solidified nickel-base superalloys of the present invention, in the operating temperature range of spring clip 76, and therefore are not suitable for use in the manufacture of spring clips 76 for application in stator subassembly 50. Furthermore, the use of aluminum or titanium alloys would result in a reduced preload capability of fasteners 74 relative to the directionally solidified nickel-base superalloy of the present invention.

The maximum allowable bending stress must also be considered in the design of spring clip 76, wherein the bending stress is computed by the following equation which is known in the art:

$$\sigma_{max} = \frac{(P_{MAX})(L)(t/2)}{I}$$

wherein:
$\sigma_{MAX}$ = maximum allowable bending stress corresponding to material yield strength;
$P_{MAX}$ = spring force resulting in maximum allowable bending stress and computed by same equation for $P_{MIN}$ except for substitution of appropriate deflection;
L, t, and I are as defined previously in $P_{MIN}$ equation.

The physical dimensions of arms 86 may be determined by satisfying the equations for $P_{MIN}$ and $\sigma_{MAX}$ using a computer-assisted iteration process. Returning to FIG. 7, it can be seen that $P_{MAX}$ results in a deflection $\delta_{MAX(1)}$ when using a conventional equiax nickel-bag superalloy and a deflection $\delta_{MAX(2)}$ when using the directionally solidified nickel-base superalloy of the present invention. Furthermore, it can be seen that the difference between the deflection corresponding to $P_{MAX}$ and the deflection corresponding to $P_{MIN}$ is RANGE(1) and RANGE(2) for the conventional equiax material and the directionally solidified material of the present invention, respectively, wherein RANGE(2) is significantly greater than RANGE(1). This is important because the utilization of the directionally solidified nickel-base superalloy permits the required preload, $P_{MIN}$, and maximum allowable bending stress, $\sigma_{MAX}$, to be achieved while accommodating a larger range of stack-up tolerances than would be possible using a conventional equiax nickel-base superalloy. The relevant stack-up tolerances are those existing along the line of action of fasteners 74 and include the relationship between first inclined surface 94 of body section 84 and contact surfaces 114 of arms 86 of spring clip 76 and the relationship between inclined surface 136 and radially outer and radially facing surface 138 of mount lugs 78 of flowpath liners 58.

The use of the directionally solidified nickel-base superalloy of the present invention also permits a minimization of a height, h, and a width, w, of body section 84 of spring clip 76, as compared to the corresponding dimensions using a conventional equiax nickel-base superalloy, and consequently, also results in a weight reduction of the body section 84. This is true because the size of body section 84 must be compatible with the physical dimensions of arm 86. Consequently, when the physical dimensions of arm 86, such as thickness t and width b are minimized due to the use of the directionally solidified nickel-base superalloy of the present invention as compared to the use of a conventional equiax nickel-base superalloy, as explained previously, height h and width w of body section 84 may also be minimized. As seen in FIG. 4, height h extends between outer break-edge surface 112 and inner surface 96 and width w extends between opposite and parallel sides 108 and 110.

In operation, arms 86 of spring clips 76 exert a spring force against corresponding ones of mount lugs 78 of flowpath liners 58 which forces the lugs 78 radially outward and axially aft against the radially inner surface 124 of casing 56 and against an inner leg 142 of T-shaped seal 60, respectively, thereby providing a means for attaching flowpath liners 58 to annular casing 56 and for positioning flowpath liners 58 in an axially abutting relationship with annular T-shaped seal 613. The force exerted by each of the arms 86 is sufficient to keep flowpath liners 58 seated during normal operating conditions of engine 10. Mount lugs 78 are integral with an axially aft portion of flowpath liner 58 which is positioned radially outward of tips 72 of blades 54, and therefore the use of spring clips 76 for attaching mount lugs 78 to casing 56 provides an accurate control of the radially extending annular clearance between blade tips 72 and the axially aft portion 70 of the radially inner surface 68 of flowpath liners 58.

In conclusion, the use of spring clips 76 of the present invention for attaching the circumferentially segmented flowpath liners 58 to high pressure compressor inner annular casing 56 provides an enhanced spatial positioning of flowpath liners 58 as compared to other means of attachment such as the tongue-and-groove and loose-fitting bolted joint concepts. The fact that spring clips 76 are made of a directionally solidified nickel-base superalloy having a relatively low modulus of elasticity in a direction 152 which is generally parallel to a longitudinal axis 146 of spring clip 76 and to the base surface 148 of each arm 86, and a relatively high modulus of elasticity in a direction 154 which is generally parallel to the centerline 150 of the holes 92 which are used to fixedly attach body sections 84 to casing 56, provides the following advantages relative to a clip made of a conventional equiax nickel-base superalloy: a required spring force may be exerted against mount lugs 78 by spring clip 76 which has a smaller physical size and reduced weight; spring clip 76 may be installed in a smaller space; spring clip 76 can accommodate a wider range of installation stack-up tolerances. Furthermore, there is no loss in the preload capability of fasteners 74 as compared to a clip made of a conventional equiax nickel-base superalloy.

While the foregoing description has set forth the preferred embodiments of the invention in particular detail, it must be understood that numerous modifications, substitutions and changes can be undertaken without departing from the true spirit and scope of the present invention as defined by the ensuing claims, and that the protection desired to be secured by Letters Patent of the United States for this invention is defined by the subject matter of the following claims.

What is claimed is:

1. A spring clip, comprising:
    a) a body section;
    b) a pair of arms integrally connected to opposing sides of said body section;
    c) wherein said spring clip is made of a directionally solidified material having a relatively low modulus of elasticity in a first direction which is generally parallel to a longitudinal axis of said spring clip and a relatively high modulus of elasticity in a second direction which is generally perpendicular to said longitudinal axis.

2. A spring clip as recited in claim 1, wherein:
    a) said body section includes a pair of holes extending through said body section; and
    b) said second direction is parallel to a centerline of each of said holes.

3. A spring clip as recited in claim 2, wherein said directionally solidified material is a nickel-base superalloy.

4. A stator sub-assembly for a gas turbine engine, said stator sub-assembly comprising:
    a) an annular casing;
    b) an annular T-shaped seal having a radially outer end positioned in a stepped land formed in a radially inner surface of said annular casing;
    c) a plurality of circumferentially segmented flowpath liners positioned radially inward of said casing; and
    d) means for attaching said flowpath liners to said annular casing and for positioning said liners in an axially abutting relationship with said annular T-shaped seal; and
    e) wherein said means for attaching and positioning comprises a plurality of spring clips, each of said spring clips made of a directionally solidified material having a relatively low modulus of elasticity in a first direction which is generally parallel to a longitudinal axis of said spring clip and a relatively high modulus of elasticity in a second direction which is generally perpendicular to said longitudinal axis.

5. A stator sub-assembly as recited in claim 4, wherein said directionally solidified material is a nickel-base superalloy.

6. A stator sub-assembly as recited in claim 4, wherein:
    a) each of said spring clips includes a body section and a pair of arms integrally connected to circumferentially opposing sides of said body section;

b) said means for attaching and positioning includes a plurality of fasteners for fixedly attaching each of said body sections to said annular casing;
c) each of said body sections includes a pair of holes extending through said body section for accepting a pair of said plurality of fasteners, wherein said second direction of said material is generally parallel to a centerline of each of said holes; and
d) said longitudinal axis is parallel to a base surface of each of said arms.

7. A stator sub-assembly as recited in claim 6, wherein:
a) each of said flowpath liners includes a radially extending mount lug located at each of circumferentially opposite ends of said liner;
b) said pair of arms of each of said spring clips resiliently engages a pair of said mount lugs, wherein a first one of said pair of mount lugs is integral with one of said flowpath liners and a second one of said pair of mount lugs is integral with a circumferentially adjacent one of said flowpath liners;
c) torquing of said fasteners forces a radially outer and radially facing surface of each of said body sections of said spring clips against said radially inner surface of said casing and forces a radially outer and axially aft facing surface of each of said body sections to contact a radially outer and axially forward facing surface of said annular T-shaped seal; and
d) the torquing of said fasteners further causes said arms of said spring clips to force respective ones of said mount lugs radially outward and axially aft, wherein a radially outer and radially facing surface of each of said mount lugs is forced against said radially inner surface of said casing and wherein each of said mount lugs is positioned in an axially abutting and sealing relationship with said annular T-shaped seal.

8. A stator sub-assembly as recited in claim 7, wherein said annular casing comprises a high pressure compressor inner annular casing and wherein each of said flowpath liners supports a plurality of stationary vanes.

9. A stator sub-assembly as recited in claim 8, wherein:
a) said directionally solidified material is a nickel-base superalloy;
b) utilization of said directionally solidified nickel-base superalloy permits a minimization of a size and a weight of said spring clips as compared to a utilization of clips made of an equiax nickel-base superalloy; and
c) the utilization of said directionally solidified nickel-base superalloy permits an accommodation of a greater range of assembly stack-up tolerances associated with said spring clips and said mount lugs of said flowpath liners as compared to the utilization of clips made of an equiax nickel-base superalloy.

* * * * *